United States Patent
Shirazi et al.

(10) Patent No.: US 11,990,695 B2
(45) Date of Patent: May 21, 2024

(54) METHOD OF RELIABLY BONDING SOLID METAL PIECE TO RIGID PCB

(71) Applicant: Apple Inc., Cupertino, CA (US)

(72) Inventors: Sam Mahin Shirazi, San Jose, CA (US); Eric T. Chiang, San Francisco, CA (US); Matthew Burke, Ottawa (CA); Tiexuan Wang, ShangHai (CN); Yong Gang Li, Suzhou (CN); Henry H. Yang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 35 days.

(21) Appl. No.: 17/662,715

(22) Filed: May 10, 2022

(65) Prior Publication Data

US 2023/0369790 A1    Nov. 16, 2023

(51) Int. Cl.
| | |
|---|---|
| *H01R 12/57* | (2011.01) |
| *H01R 4/02* | (2006.01) |
| *H01R 43/20* | (2006.01) |
| *H01R 13/22* | (2006.01) |
| *H05K 1/14* | (2006.01) |
| *H05K 1/18* | (2006.01) |

(52) U.S. Cl.
CPC ............... *H01R 12/57* (2013.01); *H01R 4/02* (2013.01); *H01R 43/205* (2013.01); *H01R 13/22* (2013.01); *H05K 1/147* (2013.01); *H05K 1/189* (2013.01); *H05K 2201/056* (2013.01); *H05K 2201/10128* (2013.01)

(58) Field of Classification Search
CPC .......... H01R 12/57; H01R 4/02; H01R 13/22; H05K 1/147
USPC .......................................................... 361/749
See application file for complete search history.

(56) References Cited

U.S. PATENT DOCUMENTS

| | | |
|---|---|---|
| 5,990,545 A | 11/1999 | Schueller et al. |
| 9,182,614 B2 | 11/2015 | Cho et al. |
| 9,709,258 B2 | 7/2017 | Rudisill et al. |
| 10,064,276 B2 | 8/2018 | Williams et al. |
| 10,090,812 B2 | 10/2018 | Modi et al. |
| 10,571,081 B2 | 2/2020 | Xiong et al. |
| 10,748,827 B2 | 8/2020 | Kim et al. |
| 2004/0222518 A1 | 11/2004 | Haba et al. |
| 2012/0234369 A1 | 9/2012 | Everett et al. |
| 2017/0105290 A1* | 4/2017 | Kim ....................... H05K 1/148 |
| 2019/0331625 A1 | 10/2019 | Fan et al. |
| 2020/0030614 A1 | 1/2020 | Stevenson et al. |
| 2020/0251436 A1* | 8/2020 | Williamson .......... H01L 21/481 |

* cited by examiner

*Primary Examiner* — Andargie M Aychillhum
(74) *Attorney, Agent, or Firm* — Aikin & Gallant, LLP

(57) ABSTRACT

Electronic assemblies and methods of attaching retention structures are described. The electronic assemblies may include a receiving substrate and a retention structure bonded to the receiving substrate. The retention structure may be patterned to include openings such as slot openings or a fishbone pattern in order to receive a pair of solder joints to bond the retention structure to a top side of the receiving substrate.

21 Claims, 4 Drawing Sheets

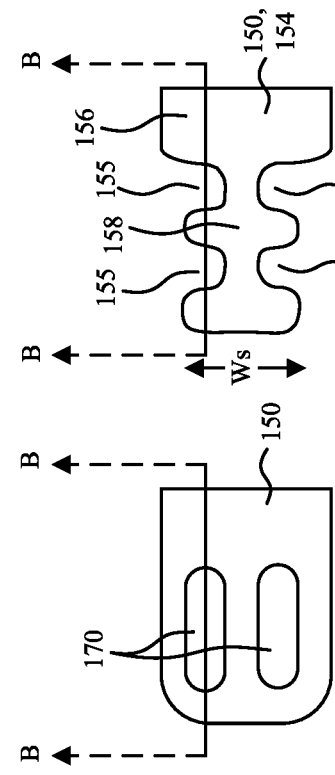
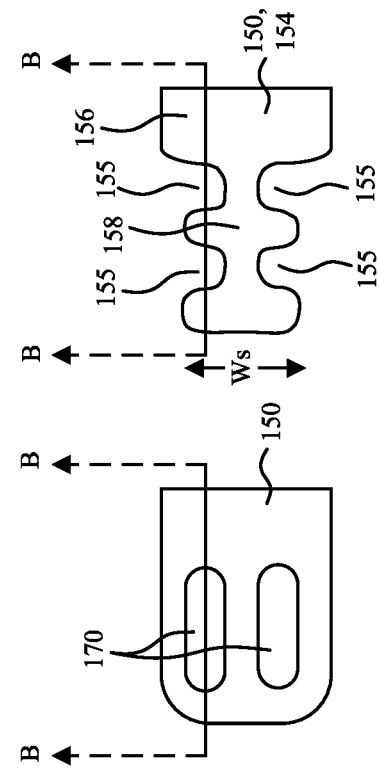
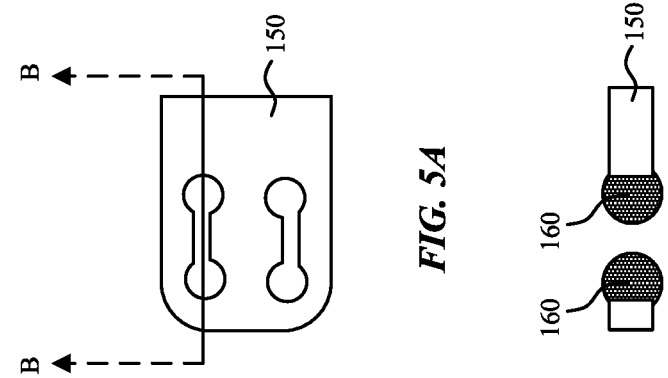
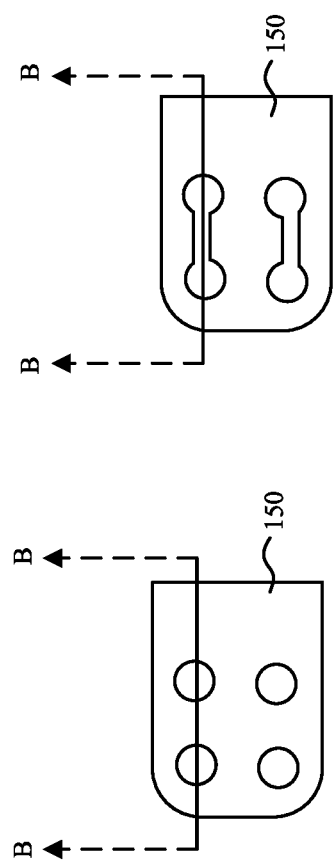
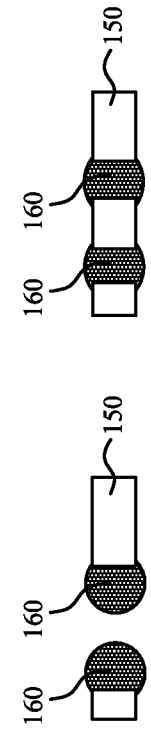
FIG. 4A  FIG. 5A  FIG. 6A  FIG. 7A
FIG. 4B  FIG. 5B  FIG. 6B  FIG. 7B

METHOD OF RELIABLY BONDING SOLID METAL PIECE TO RIGID PCB

BACKGROUND

Field

Embodiments described herein relate to microelectronic assembly.

Background Information

The current market demand for portable and mobile electronic devices such as mobile phones, personal digital assistants (PDAs), digital cameras, portable players, gaming, wearables, and other mobile devices requires the integration of more performance and features into increasingly smaller spaces. Furthermore, additional numbers of components such as sensors, light sources, cameras, antennae, etc. are being integrated into increasingly small form factors within the electronic devices. Accordingly, flexible printed circuit boards (PCBs) are becoming more common, where unlike traditional rigid PCBs, the flexible PCBs (also referred to as flex boards or flexible printed circuits) can be bent, folded or twisted to meet design objectives. Such flex boards commonly include a flexible substrate (e.g. polymer such as polyimide, polyester, polyethylene phthalate, etc.) with printed circuit pattern (e.g. metal pattern such as copper) on one or both sides of the flexible substrate. Various packages, components, PCBs, etc. can be connected to different locations on the printed circuit pattern to meet design objectives.

SUMMARY

Electronic assemblies and methods of attaching retention structures are described. The electronic assemblies may include a receiving substrate and a retention structure bonded to the receiving substrate. In an embodiment, the retention structure includes one or more slot openings and a pair of solder joints within the each of the one or more slot openings and bonded to a top side of the receiving substrate. In an embodiment, the retention structure includes a base including a head and spine extending from the head, and one or more pairs of (e.g. semi-elliptical) recesses through a width of the spine. Pairs of solder joints can be located within the pair of recesses to bond the retention structure to the top side of the receiving substrate. In each of the embodiments, a reduced area of the retention structure may facilitate concentration of thermal laser energy to the solder material during bonding rather than the surrounding retention structure, further facilitating reflow of the solder material beneath the retention structure to increase bonding area and bond strength of the solder joints.

BRIEF DESCRIPTION OF THE DRAWINGS

FIG. 4A is a schematic top view illustration of a plurality of through holes in a retention structure.

FIG. 4B is a schematic cross-sectional side view illustration of solder joints within the through holes taken along line B-B of FIG. 4A.

FIG. 5A is a schematic top view illustration of a plurality of dogbone openings in a retention structure.

FIG. 5B is a schematic cross-sectional side view illustration of solder joints within a dogbone opening taken along line B-B of FIG. 5A.

FIG. 6A is a schematic top view illustration of a plurality of slot openings in a retention structure.

FIG. 6B is a schematic cross-sectional side view illustration of solder joints within a slot opening taken along line B-B of FIG. 6A.

FIG. 7A is a schematic top view illustration of a plurality of fishbone pattern in a retention structure.

FIG. 7B is a schematic cross-sectional side view illustration of solder joints within a fishbone opening along line B-B of FIG. 7A.

DETAILED DESCRIPTION

Figure 1:
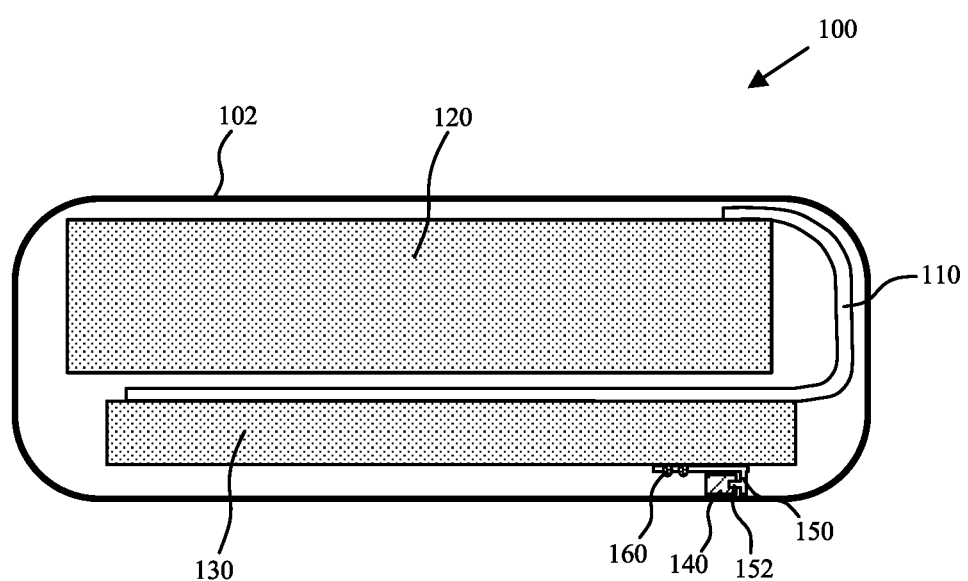
FIG. 1 is a schematic cross-sectional side view illustration of an electronic device including multiple assemblies attached to a flexible PCB in accordance with an embodiment.

Embodiments describe structures and methods for solder bonding a retention structure to a receiving substrate. In accordance with embodiments, the retention structure may be a rigid/metal assembly including openings through which solder jetting is used to bond the retention structure to the underlying receiving substrate, such as a PCB. The retention structures in accordance with embodiments can be a variety of structures designed to be retained on the receiving substrate, such as PCBs, packages, display panels, etc. In an embodiment, the retention structure is a rigid/metal assembly to which an additional component (sensor, light source, camera, antenna, etc.) can be attached, for example with one or more finger clips.

In one aspect, embodiments describe a microelectronic assembly structure in which a retention structure is both reliably bonded to a receiving substrate while allowing for flexibility in placement location, which can ultimately lead to improved placement accuracy. In particular, the receiving substrate may be attached to a flexible PCB. It has been observed that during product integration variations of the flexible PCB location (e.g. due to folding differences, etc.) can modify location of the attached receiving substrate, and hence the resulting location of the retention structure and any components associated with the retention structure. In accordance with embodiments, the retention structure is designed with bonding openings/shapes such as "slots" or a "fishbone" pattern that can accommodate flexible bonding location while also facilitating solder reflow and wetting for improved bonding (shear) strength with the receiving substrate.

In accordance with embodiments, laser solder jetting can be used to attach the retention structure to the receiving substrate where a laser to is used to melt a solder ball inside a nozzle and shoot the molten solder to a target pad via pressurized gas (e.g. nitrogen) to be reflowed and form a solder joint. It has been observed that thermal efficiency can be a key factor for such a laser solder jetting process in order provide solder joint quality and protect the underlying receiving substrate or nearby component(s) from damage. In accordance with embodiments, specific opening/shapes in the form of "slots" or "fishbone" patterns are described which can facilitate thermal transfer of the laser energy to the solder material, the use of lower laser energy, and consequently increase reflow/wetting of the solder material and resultant shear strength (i.e. adhesion) of the solder bond while also enhancing the ability for post-assembly inspection. The openings/shapes in accordance with embodiments may additionally facilitate re-work, and the ability to place additional solder joints when desired.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known packaging processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "underneath", "to", "between" and "on" as used herein may refer to a relative position of one layer with respect to other layers. One layer "over", "underneath" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of an electronic assembly 100 including multiple subassemblies attached to a flexible PCB 110 in accordance with an embodiment. As shown, the electronic assembly 100 can include a housing 102 within which various systems and subsystems are contained. In an embodiment, the electronic device includes a flexible PCB 110 to which various subassemblies (e.g. PCBs, packages, display panels, batteries, components, etc.) can be connected. For example, a receiving substrate 130, such as a rigid PCB, is bonded to one end of a flexible PCB 110, and another (larger) subassembly such as display panel 120 is bonded to an opposite end of the flexible PCB 110. As shown, the flexible PCB 110 may be wrapped behind the display panel 120 such that the receiving substrate 130 is also positioned behind the display panel 120. A retention structure 150 may be bonded to a top side 132 of the receiving substrate 130 with a plurality of solder joints 160. In a particular embodiment the retention structure 150 is a rigid/metal retention structure including one or more finger clips 152 which can be used to attach a component 140 at a particular location.

Figure 2:
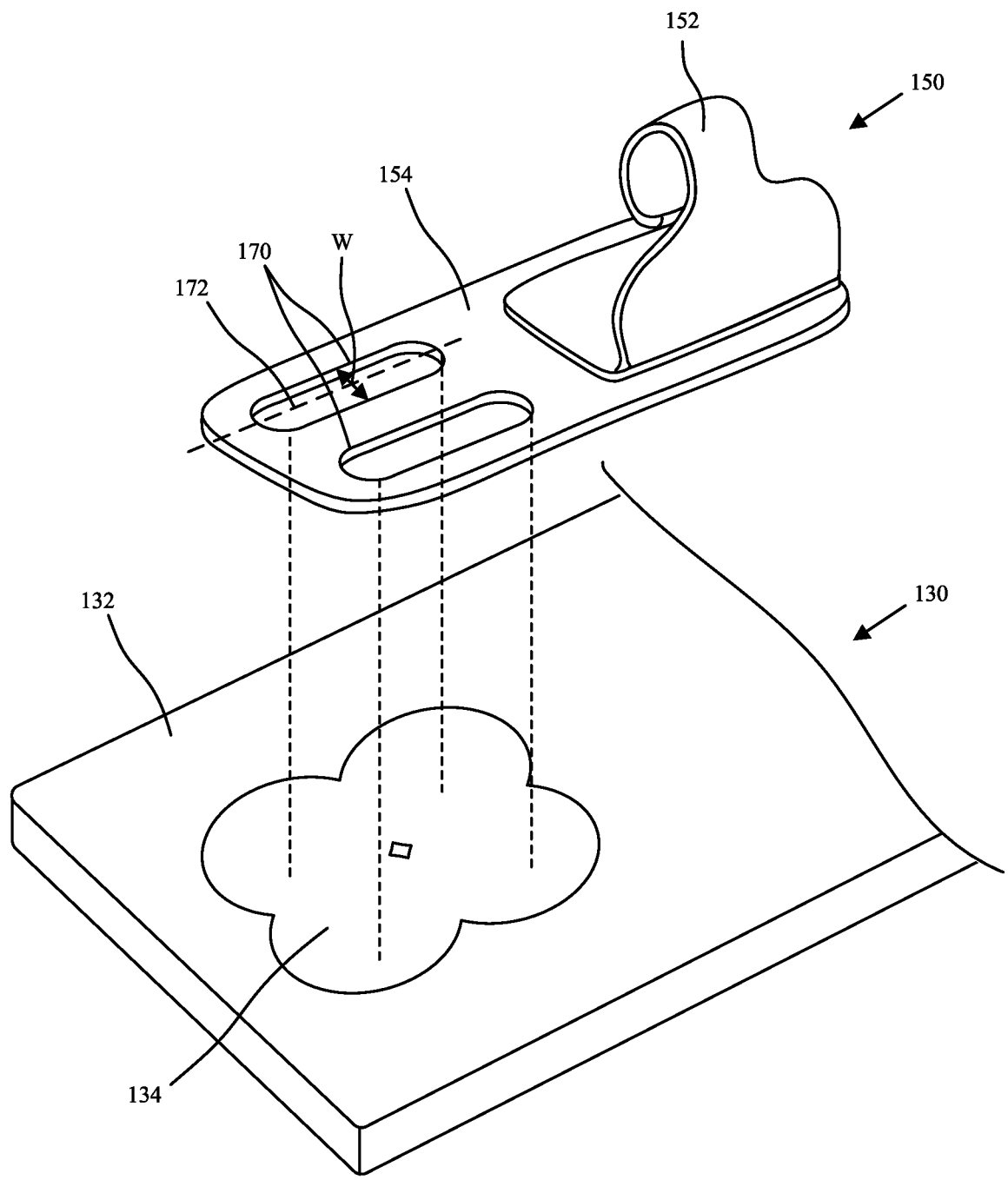
FIG. 2 is a schematic isometric view illustration of a retention structure aligned over a top side of a receiving substrate in accordance with an embodiment.

FIG. 2 is a schematic isometric view illustration of a retention structure 150 aligned over a top side 132 of a receiving substrate 130 in accordance with an embodiment. In an embodiment, the receiving substrate 130 is a PCB, and may include one or more landing pads 134. The landing pad(s) 134 may be formed of a material, such as a metal, which can be wetted by solder. The landing pads 134 may optionally provide electrical interconnection to the retention structure 150, though this is not required. As shown, the retention structure may have a base 154 through which one or more slot openings 170 are formed. In an embodiment, each slot opening 170 has a widest width (W) at a middle of a longitudinal length of the slot opening in a longitudinal direction 172 of the slot opening 170. As shown in FIG. 2, the receiving substrate 130 can include a single landing pad 134 area, or multiple landing pad 134 areas that may or may not overlap.

Figure 3A:
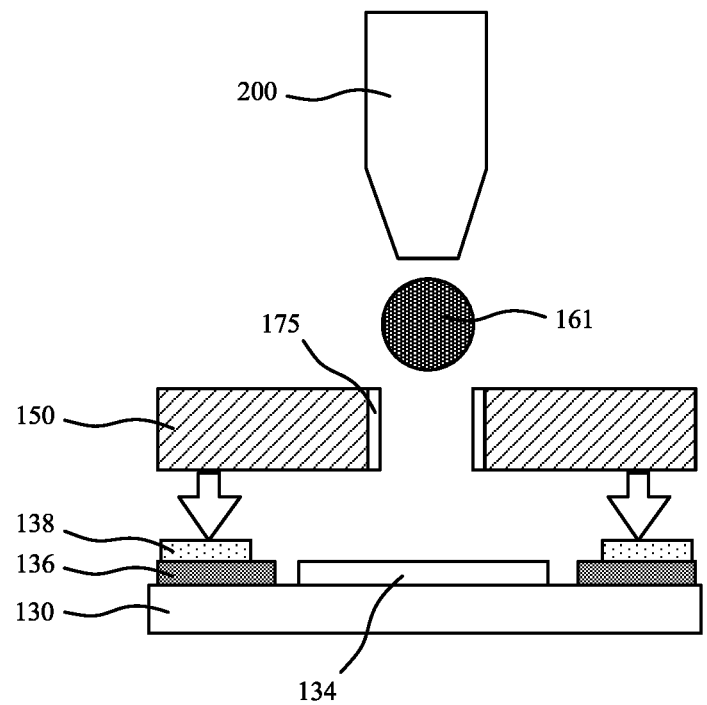
FIG. 3A is a schematic cross-sectional side view illustration of solder jetting a retention structure to a receiving substrate in accordance with an embodiment.

Referring now to FIG. 3A, a schematic cross-sectional side view illustration is provided for solder jetting of a retention structure 150 to a receiving substrate 130 in accordance with an embodiment. As shown, the retention structure may optionally be placed onto the receiving substrate 130 with an adhesive layer 138, such as an adhesive tape. The adhesive layer 138 may additionally be placed onto a solder mask layer 136 which surrounds the landing pad(s) 134. In accordance with embodiments the retention structure 150 can include one or more openings, such as slot openings or (e.g. semi-elliptical) recesses. A liner 175 may line the sidewalls of the openings in order to facilitate wetting and adhesion of the reflowed solder ball 161 that is dispensed from the nozzle 200.

Figure 3B:
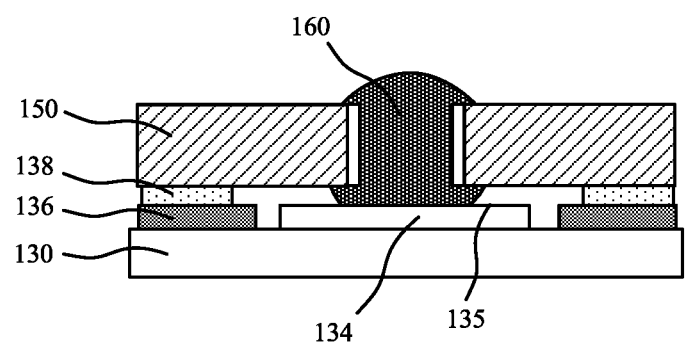
FIG. 3B is a schematic cross-sectional side view illustration of solder joint wetting of an underlying receiving substrate in accordance with an embodiment.

FIG. 3B is a schematic cross-sectional side view illustration of solder joint 160 wetting of an underlying receiving substrate in accordance with an embodiment. More particularly, the solder joints 160 may wet a portion of a top surface 135 of the landing pad 134 that is directly underneath the retention structure 150. For example, wetting may occur within a small standoff height created by the solder mask layer 136 and/or adhesive layer 138. This increased area may thus correspond to increased shear bonding strength with the landing pad 134. The solder joints 160 may additionally flow partially over a top side of the retention structure 150 forming a rivet, and further increasing solder joint 160 integrity.

In accordance with embodiments it has been observed that thermal efficiency can be a key factor for such a laser solder jetting process in order provide solder joint quality and also protect the underlying receiving substrate or nearby component(s) from damage. The slot openings and fishbone recesses in accordance with embodiments may facilitate transfer of laser energy during the laser solder jetting process to the solder material rather than retention structure material. Furthermore, the removed volume can enhance the ability for post-assembly inspection.

In order to demonstrate the effectiveness of the slot openings and fishbone shape with (e.g. semi-elliptical) recesses various retention structure test samples were prepared with different opening types, including through hole openings, dogbone openings, slot openings, and the fishbone pattern. Each retention structure was then solder jet bonded to a landing pad area on a receiving substrate with four solder joints. Schematic top view and cross-sectional side view illustrations are provided for the test structures in FIGS. 4A-4B (through hole openings), FIGS. 5A-5B (dogbone openings), FIGS. 6A-6B (slot openings), and FIGS. 7A-7B (semi-elliptical recesses, fishbone pattern).

During assembly, the laser energy used for through hole solder joints was selected as baseline, and laser energy required for solder reflow was measured for other opening types and compared to the baseline. Joint strength of the solder joints was then tested for each of the samples by performing a peel test, and monitoring the force required to break the solder joints from the receiving substrate. In each sample, solder joint failure occurred at the solder joint interface with the landing pad area. The test results are presented in Table I.

TABLE I

| Opening Type | Through hole | Dogbone | Slot opening | Fishbone |
|---|---|---|---|---|
| Shear force | ~3 kg | ~4-6 kg | ~5-8 kg | ~5-8 kg |
| Laser energy reduction | Baseline | ~30-40% | ~30-40% | ~30-40% |

As shown in Table I, each of the dogbone, slot opening, and fishbone patterns required approximately 30-40% less laser energy for reflow. This energy reduction may be the result of less surrounding material and less heat transfer (loss). Use of less laser energy may lead to a higher quality solder joint, avoid damage to the receiving substrate and nearby components, ad increase the laser jetting nozzle lifetime. In accordance with embodiments, the slot openings and fishbone pattern resulted in the largest bonding strength gains compared to the solder joints formed within through holes. These bond strength gains may likewise be the result of less surrounding material, and lessened heat transfer to the surrounding retention structure, which allows for increased wetting directly beneath the retention structure. Furthermore, the slot openings and fishbone patterns can facilitate simpler visual inspection of solder joints. The slot openings and fishbone patterns can also facilitate rework. For example, additional solder joint(s) can be placed within available area in the slot opening, between the first pair of solder joints. Additional solder joint(s) can also be placed along perimeter edges of the fishbone pattern, either within or outside of the recesses.

In an embodiment, an electronic assembly includes a receiving substrate 130 and a retention structure 150 bonded to the receiving substrate. The retention structure may include one or more slot openings 170 and a pair of solder joints 160 within each of the slot openings and bonded to a top side 132 of the receiving substrate. More particularly, each solder joint of the pair of solder joints may wet a top surface 135 of a landing pad 134 of the receiving substrate that is directly underneath a base 154 of the retention structure 150. Referring briefly back to FIG. 6A and FIG. 2, in an embodiment a first solder joint of the pair of solder joints is located at an end of the slot opening 170 along a longitudinal direction 172 of the slot opening. In an embodiment, the pair of solder joints may be located at opposite ends of the slot opening 170. It is also envisioned that at least one of the solder joint can be located between the opposite ends, for example, to facilitate flexible location if there are underlying landing pad area constraints.

Still referring to FIG. 2, in an embodiment the slot opening 170 has a widest width (W) at a middle of a longitudinal length of the slot opening in the longitudinal direction 172. As shown, the width may have parallel walls. This is not necessarily required, and in an alternative embodiment the slot opening width at the middle of the longitudinal length is greater than at the ends of the slot opening.

In an embodiment, an electronic assembly includes a receiving substrate 130 and a retention structure 150 bonded to the receiving substrate. As shown in FIGS. 7A-7B, the retention structure may include a base 154 forming a head 156 and spine 158 extending from the head 156, the spine 158 including a first pair of recesses 155 through a width (Ws) of the spine 158. For example, the recesses 155 may be semi-elliptical or other shape, such as concave, hourglass, etc. In the illustrated embodiment, the pairs of recesses 155 can be formed in laterally opposite sides of the width (Ws) of the spine 158. The recesses 155 can also be formed in a same side of the spine 158, or on opposite sides but laterally offset from one another. A pair of solder joints 160 can be located within the first pair of recesses 155 and bonded to a top side 132 of the receiving substrate. More particularly, each solder joint of the pair of solder joints may wet a top surface 135 of a landing pad 134 of the receiving substrate that is directly underneath the spine 158 of the retention structure 150.

In accordance with embodiments the solder joints 160 can be formed of a high temperature solder material, characterized by a reflow temperature of at least 230-240° C. An exemplary solder material may include an alloy include Sn, Ag and Cu. It has been observed that high temperature solder materials may have superior reflow, and wetting capabilities relative to low temperature solder materials. Thus, concentration of laser energy in accordance with embodiments, with mitigated thermal dissipation into the surrounding retention structure 150, may facilitate joint formation with sufficient bond strength. The receiving substrate 130 in accordance with embodiments can be a variety of structures, including a PCB that is bonded to a flexible PCB, and the retention structure can be a variety of structures including a metal assembly including one or more finger clips in a particular embodiment. A component may additionally be attached to the one or more finger clips.

In utilizing the various aspects of the embodiments, it would become apparent to one skilled in the art that combinations or variations of the above embodiments are possible for solder bonding a retention structure to a substrate. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic assembly comprising:
a receiving substrate including a landing pad;
a retention structure bonded to the receiving substrate;
wherein the retention structure includes a base and a slot opening through the base; and
a pair of solder joints within the slot opening and bonded to a top side of the receiving substrate, the pair of solder joints including a first solder joint located at an end of the slot opening a long a longitudinal direction of the slot opening;
wherein each solder joint of the pair of solder joints wets a top surface of the landing pad of the receiving substrate directly underneath the base of the retention structure, and the first solder joint wets the top surface of the landing pad directly underneath the base of the retention structure in the longitudinal direction of the slot opening.

2. The electronic assembly of claim 1, further comprising an antenna attached to the retention structure.

3. The electronic assembly of claim 1, wherein the receiving substrate is bonded to a flexible printed circuit board (PCB).

4. The electronic assembly of claim 3, wherein the flexible PCB is wrapped behind a display panel.

5. The electronic assembly of claim 1, wherein the slot opening has a widest width at a middle of a longitudinal length of the slot opening in the longitudinal direction.

6. The electronic assembly of claim 1, where each solder joint is formed of a solder material characterized by a reflow temperature of greater than 230° C.

7. The electronic assembly of claim 1, wherein each solder joint includes an alloy comprising Sn, Ag and Cu.

8. The electronic assembly of claim 1, wherein the receiving substrate is a printed circuit board that is bonded to a flexible printed circuit board.

9. The electronic assembly of claim 1, wherein the retention structure is a metal assembly including one or more finger clips.

10. The electronic assembly of claim 9, further comprising a component attached to the one or more finger clips.

11. An electronic assembly comprising:
a receiving substrate;
a retention structure bonded to the receiving substrate;
wherein the retention structure includes a base forming a head and spine extending from the head, the spine including a first pair of recesses through a width of the spine; and
a pair of solder joints within the first pair of recesses and bonded to a top side of the receiving substrate.

12. The electronic assembly of claim 11, wherein each solder joint of the pair of solder joints wets a top surface of a landing pad directly underneath the spine.

13. The electronic assembly of claim 12, further comprising:
a second pair of recesses through a width of the spine; and
a second pair of solder joints within the second pair of recesses and bonded to the top side of the receiving substrate.

14. The electronic assembly of claim 13, wherein each solder joint of the second pair of solder joints wets the top surface of the landing pad directly underneath the spine.

15. The electronic assembly of claim 12, where each solder joint is formed of a solder material characterized by a reflow temperature of greater than 230° C.

16. The electronic assembly of claim 12, wherein each solder joint includes an alloy comprising Sn, Ag and Cu.

17. The electronic assembly of claim 12, wherein the receiving substrate is a printed circuit board that is bonded to a flexible printed circuit board.

18. The electronic assembly of claim 12, wherein the retention structure is a metal assembly including one or more finger clips.

19. The electronic assembly of claim 18, further comprising a component attached to the one or more finger clips.

20. The electronic assembly of claim 12, wherein the first pair of recesses are formed in laterally opposite sides of the width of the spine.

21. The electronic assembly of claim 12, wherein the first pair of recesses are semi-elliptical recesses.

* * * * *